United States Patent
Sung

(10) Patent No.: US 12,062,740 B2
(45) Date of Patent: Aug. 13, 2024

(54) SEMICONDUCTOR DEVICE WITH AN ARRANGEMENT OF RECESSES FOR RECEIVING ELECTRODES

(71) Applicant: SUZHOU LEKIN SEMICONDUCTOR CO., LTD., Taicang (CN)

(72) Inventor: Youn Joon Sung, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 780 days.

(21) Appl. No.: 17/260,726

(22) PCT Filed: Jul. 17, 2019

(86) PCT No.: PCT/KR2019/008831
§ 371 (c)(1),
(2) Date: Jan. 15, 2021

(87) PCT Pub. No.: WO2020/022695
PCT Pub. Date: Jan. 30, 2020

(65) Prior Publication Data
US 2021/0273136 A1 Sep. 2, 2021

(30) Foreign Application Priority Data
Jul. 18, 2018 (KR) .................. 10-2018-0083562

(51) Int. Cl.
*H01L 33/38* (2010.01)
*H01L 33/14* (2010.01)
*H01L 33/62* (2010.01)

(52) U.S. Cl.
CPC ............ *H01L 33/382* (2013.01); *H01L 33/14* (2013.01); *H01L 33/62* (2013.01)

(58) Field of Classification Search
CPC ........ H01L 33/382; H01L 33/14; H01L 33/62
(Continued)

(56) References Cited

U.S. PATENT DOCUMENTS 10,998,478 B2 * 5/2021 Moon .................. H01L 33/382
2014/0027789 A1 1/2014 Katona et al.
(Continued)

FOREIGN PATENT DOCUMENTS

JP 2005-39264 A 2/2005
KR 10-0635920 B1 10/2006
(Continued)

*Primary Examiner* — Xia L Cross
(74) *Attorney, Agent, or Firm* — Birch, Stewart, Kolasch & Birch, LLP

(57) ABSTRACT

An embodiment provides a semiconductor device comprising: a semiconductor structure including a first conductive semiconductor layer, an active layer, a second conductive semiconductor layer, and a plurality of first recesses and second recesses which extend through the second conductive semiconductor layer and the active layer and are arranged up to one region of the first conductive semiconductor layer, a first electrode disposed inside each of the first recesses and second recesses to be electrically connected to the first conductive semiconductor layer, and a second electrode electrically connected to the second conductive semiconductor layer, wherein the first conductive semiconductor layer, the active layer, the second conductive semiconductor layer include aluminum, and the number of most adjacent recesses in the plurality of second recesses is fewer than that in the plurality of first recesses and the plurality of second recesses include multiple recesses, each having an area larger than that of each of the plurality of first recesses.

20 Claims, 12 Drawing Sheets

(58) Field of Classification Search
USPC .......................................................... 257/79
See application file for complete search history.

(56) References Cited

U.S. PATENT DOCUMENTS

2018/0108675 A1\* 4/2018 Schmidt .................. H01L 21/84
2021/0273136 A1\* 9/2021 Sung ..................... H01L 33/387

FOREIGN PATENT DOCUMENTS

| KR | 10-2014-0102422 A | 8/2014 |
| KR | 10-2016-0077374 A | 7/2016 |
| KR | 10-2016-0138792 A | 12/2016 |

\* cited by examiner

[FIG. 2a]
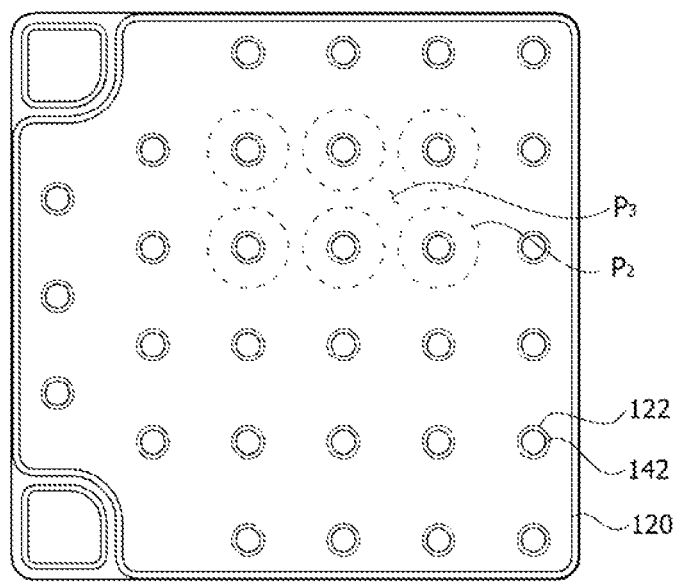
[FIG. 2b]
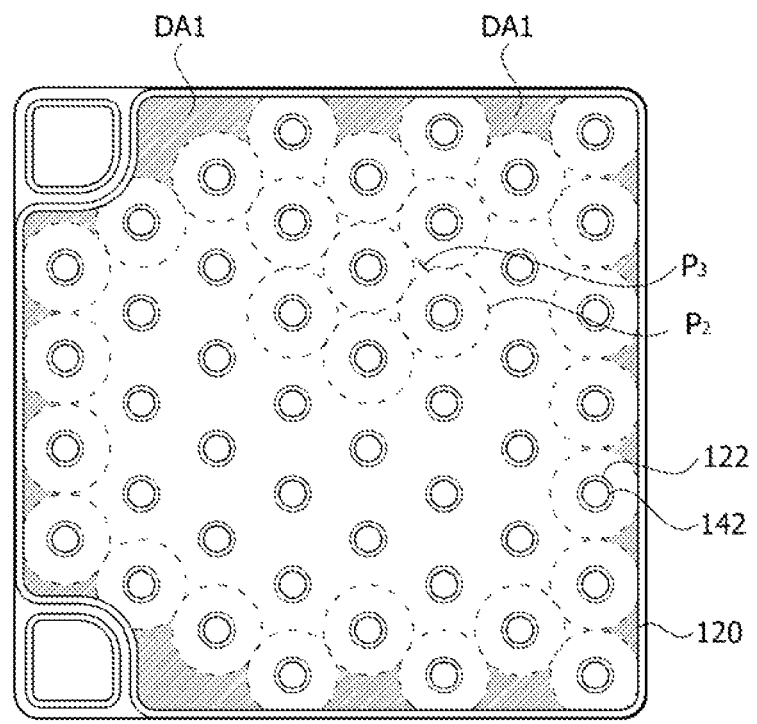

[FIG. 2c]
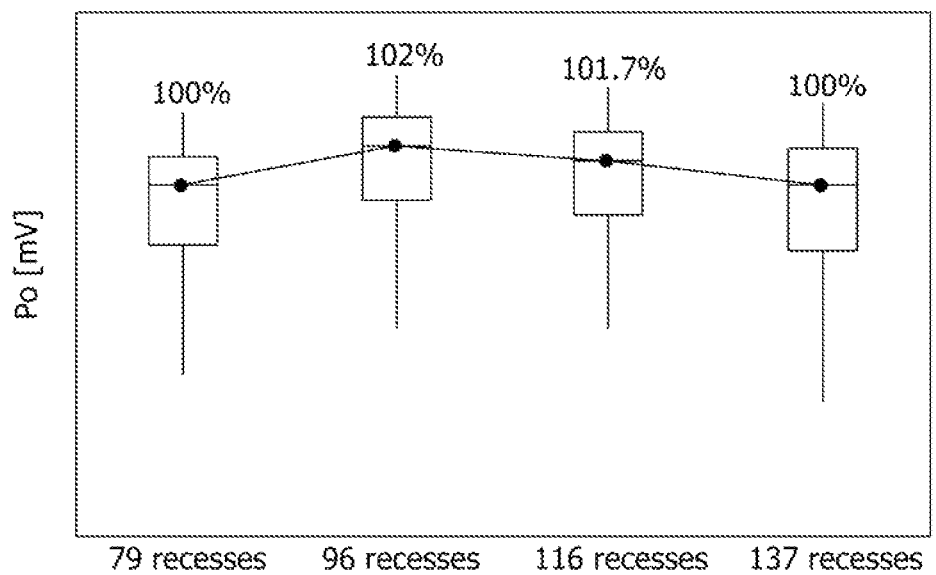
[FIG. 2d]
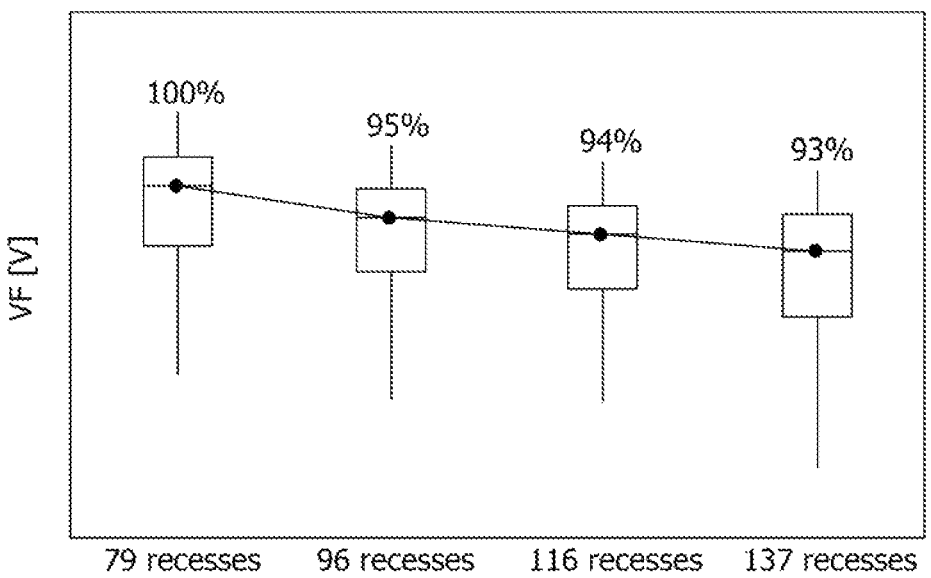

【FIG. 3】
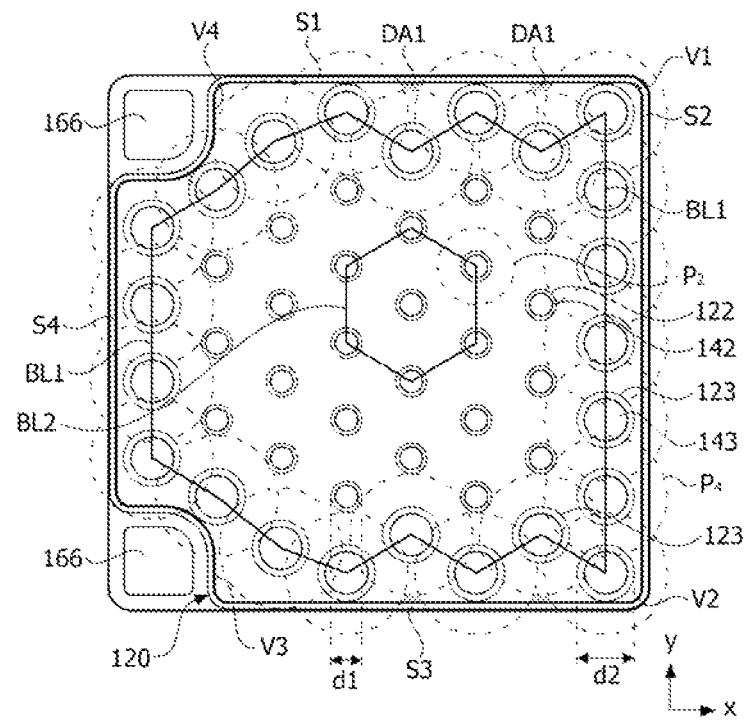
【FIG. 4】
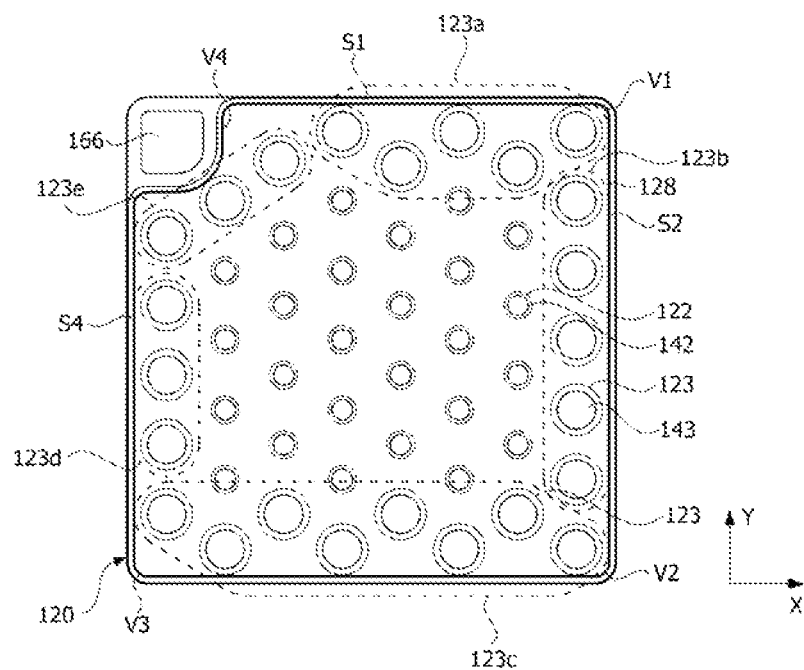

【FIG. 5a】
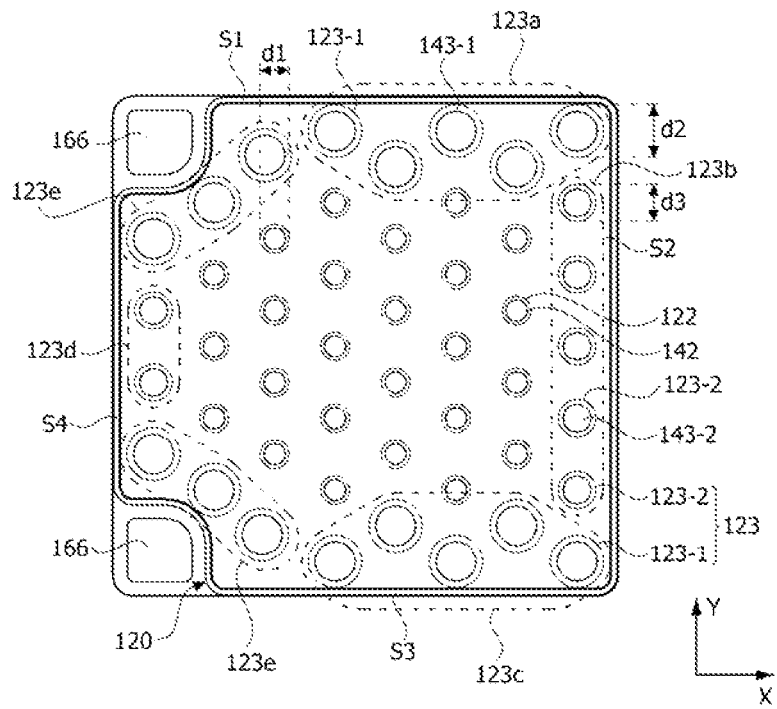
【FIG. 5b】
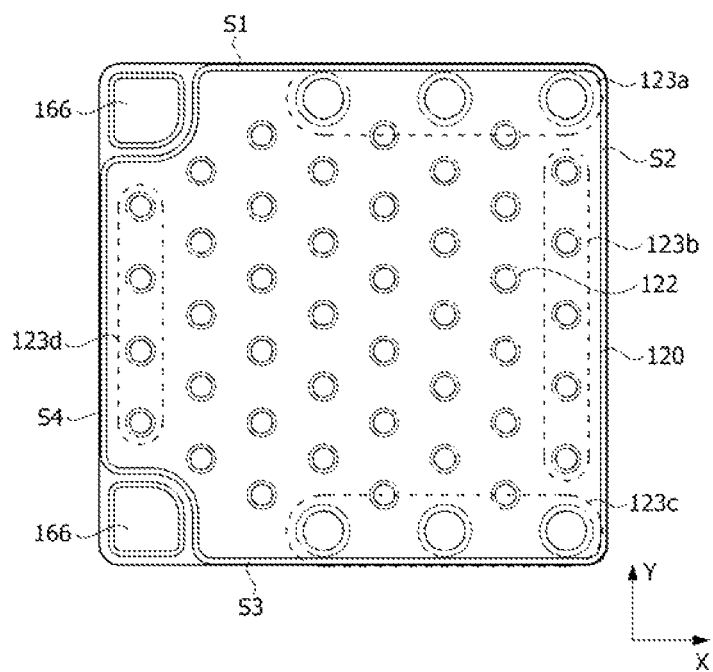

【FIG. 5c】
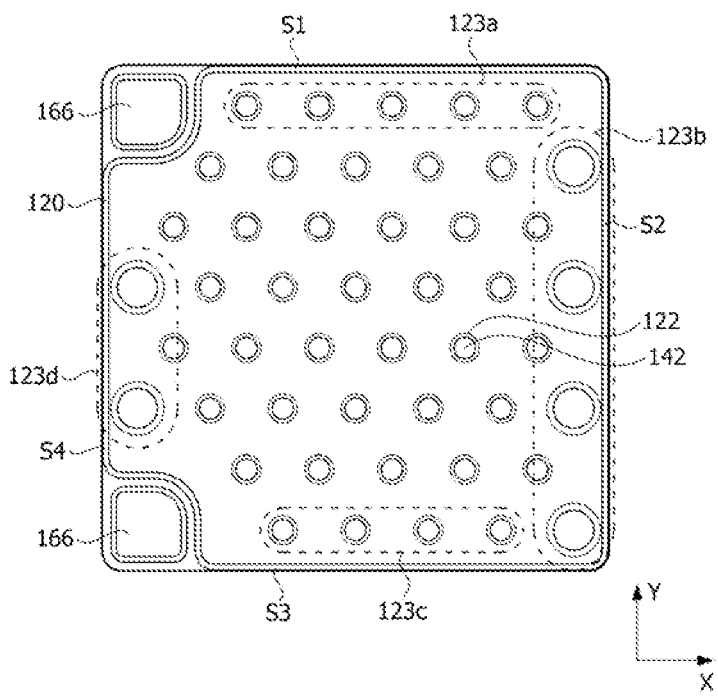
【FIG. 6】
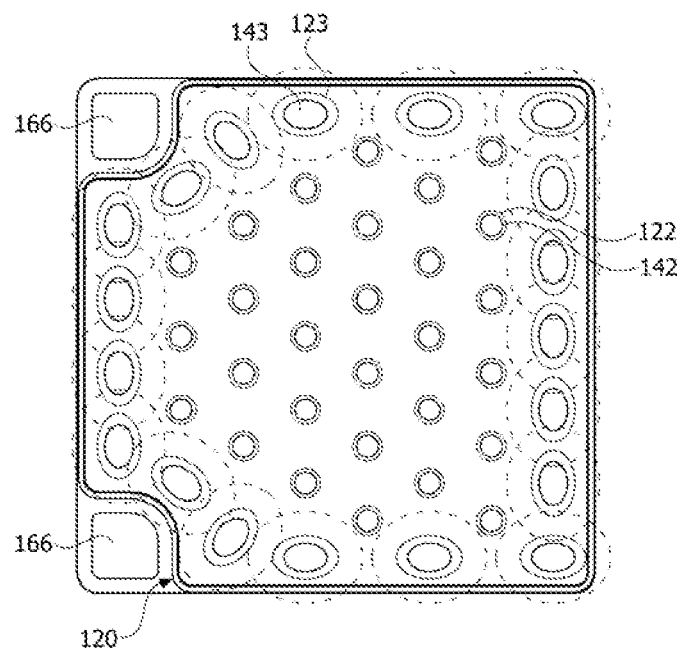

【FIG. 7】
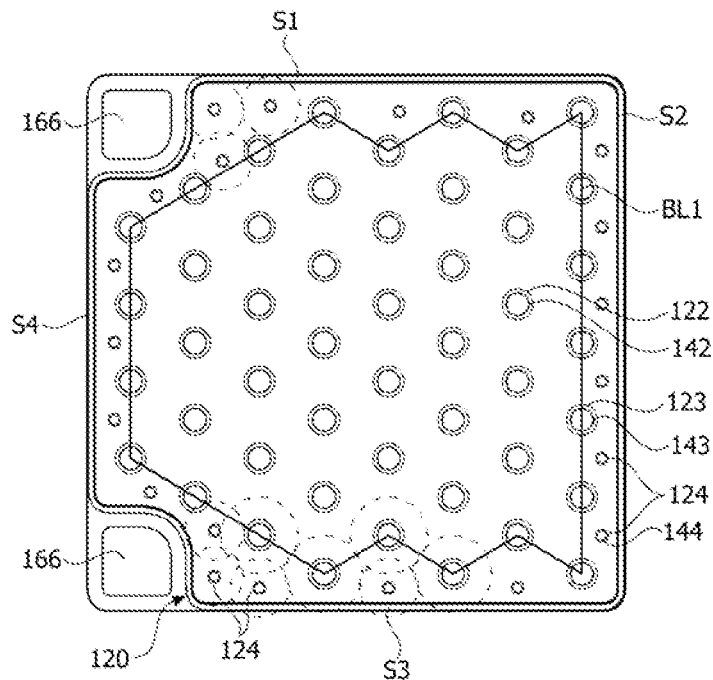
【FIG. 8】
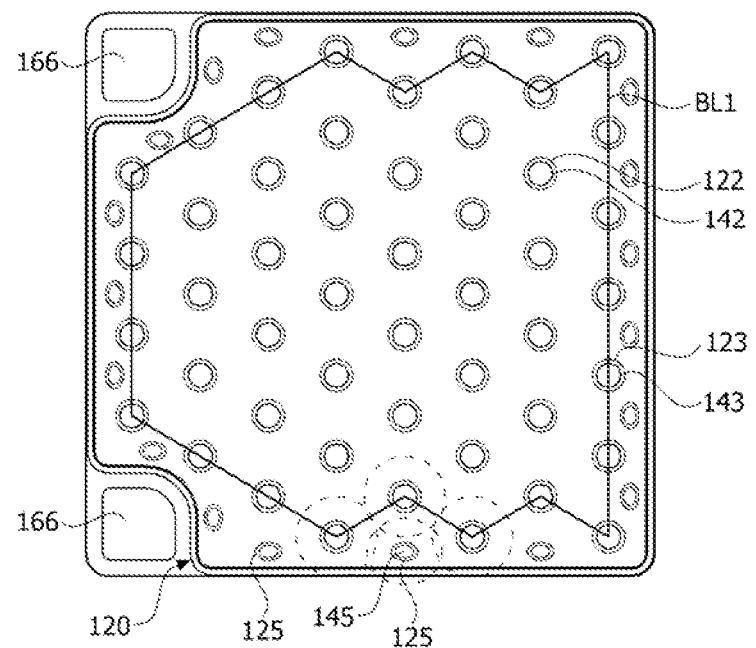

【FIG. 9】
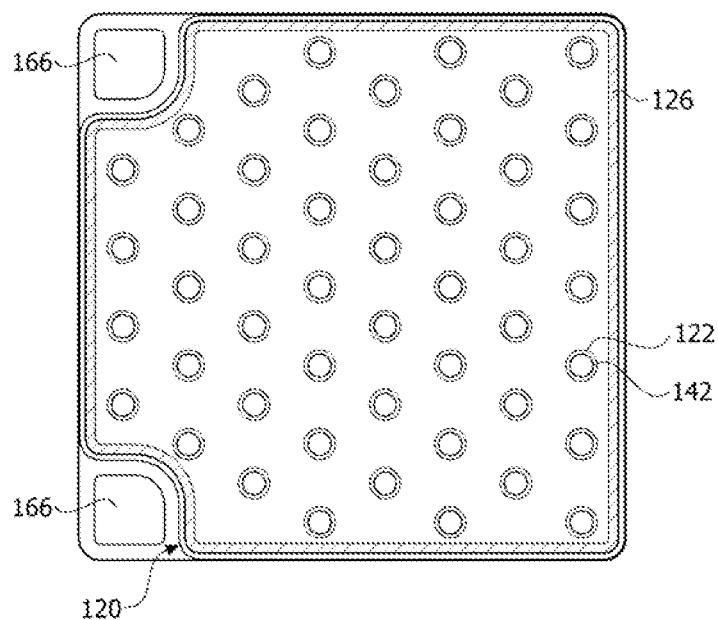
【FIG. 10】
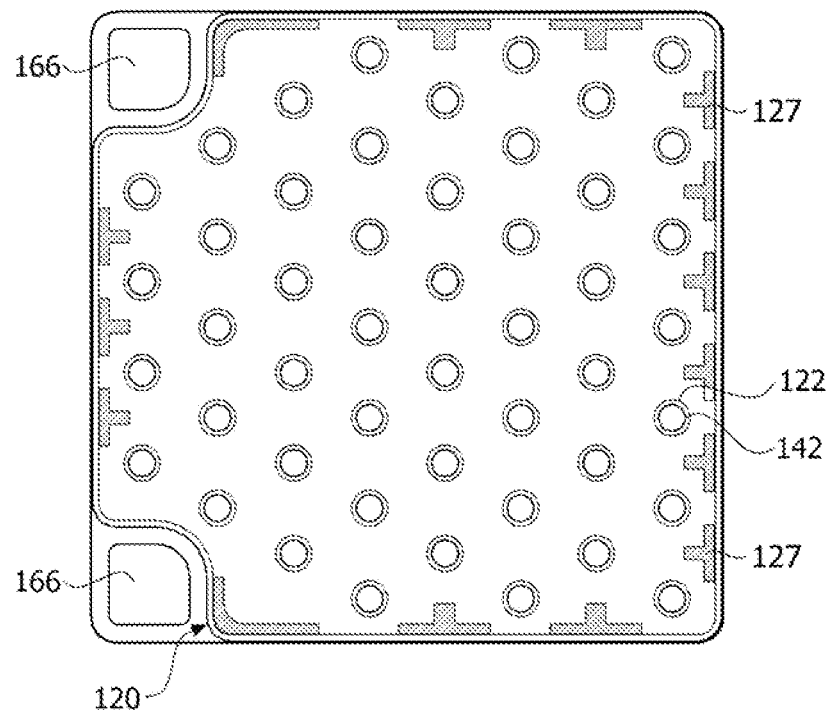

[FIG. 12]
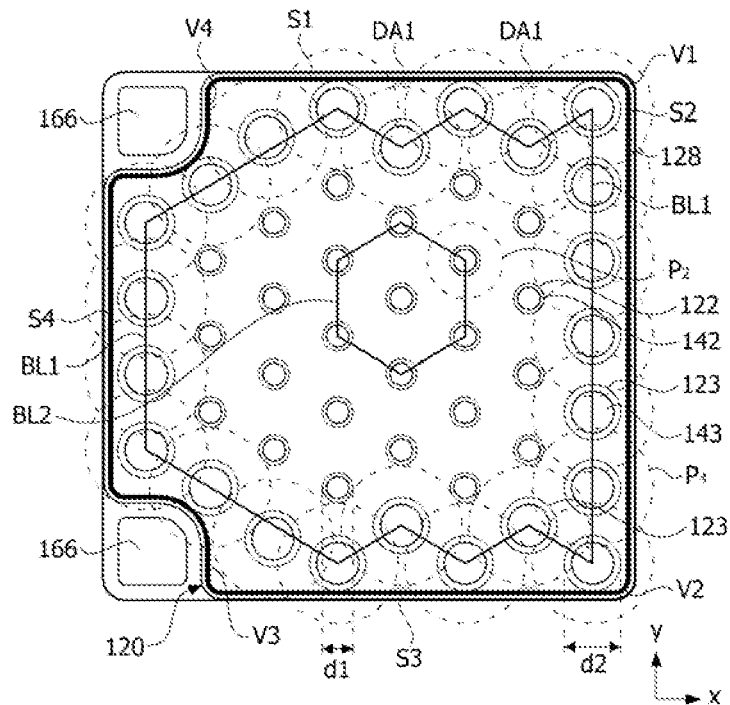
[FIG. 13]
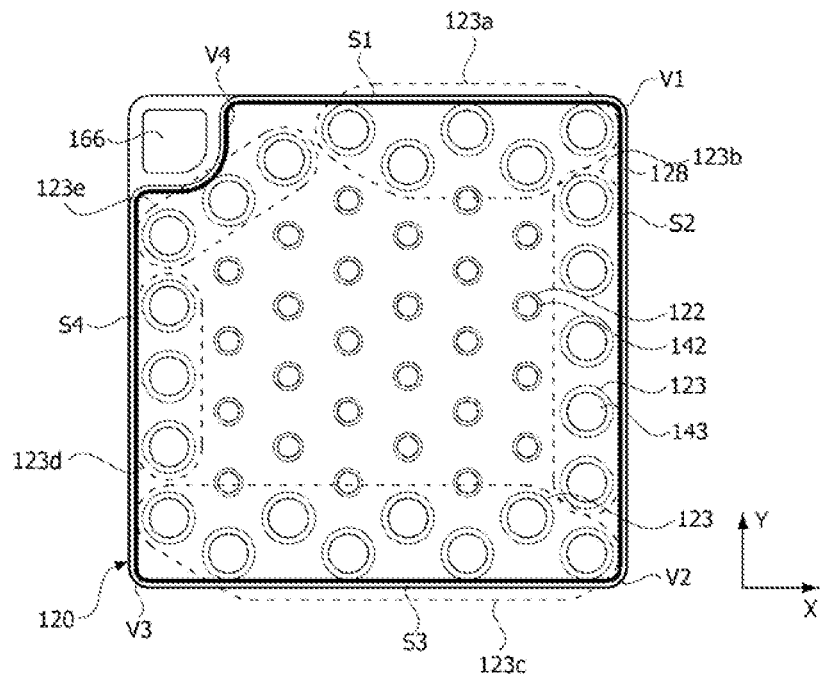

[FIG. 14]
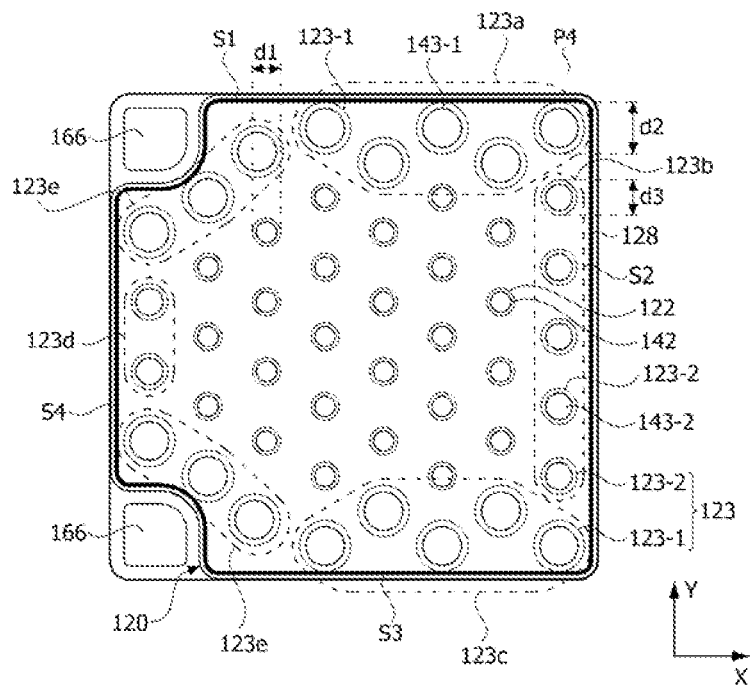
[FIG. 15]
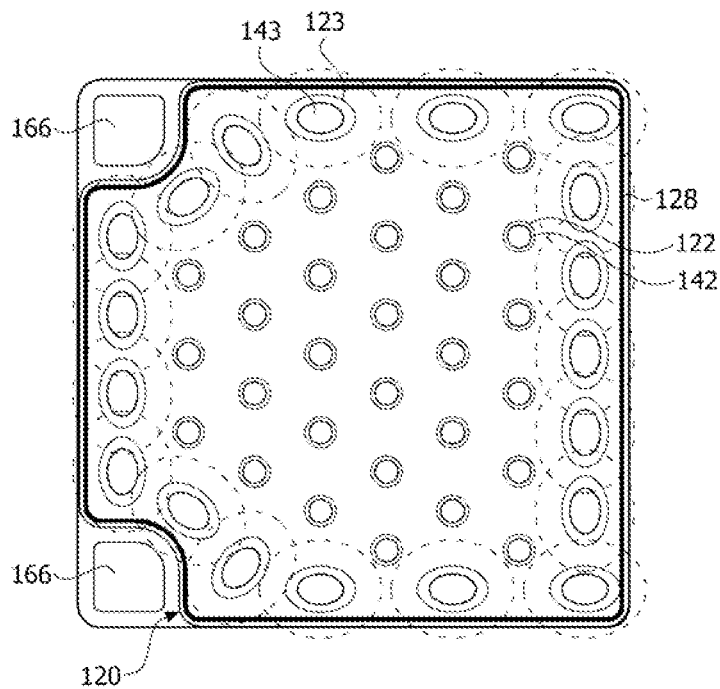

[FIG. 16]
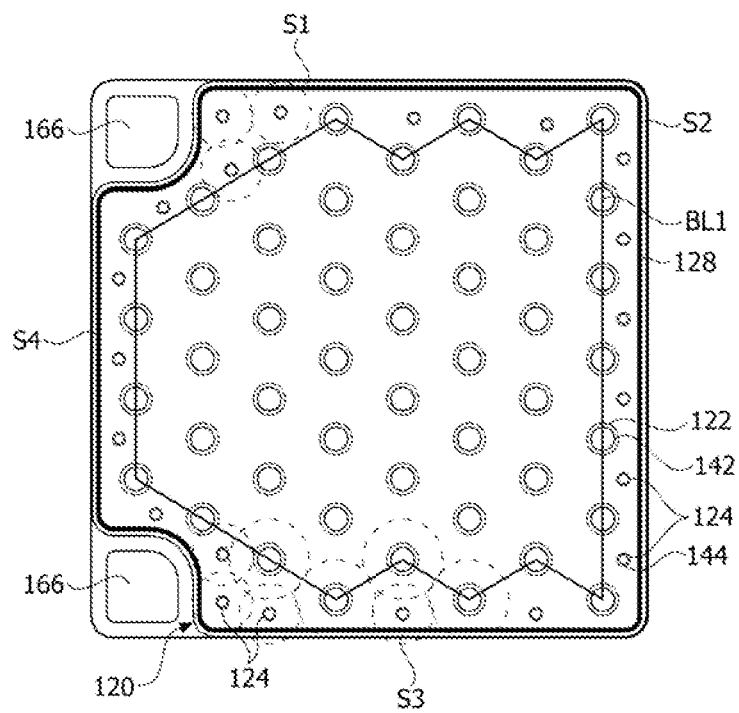
[FIG. 17]
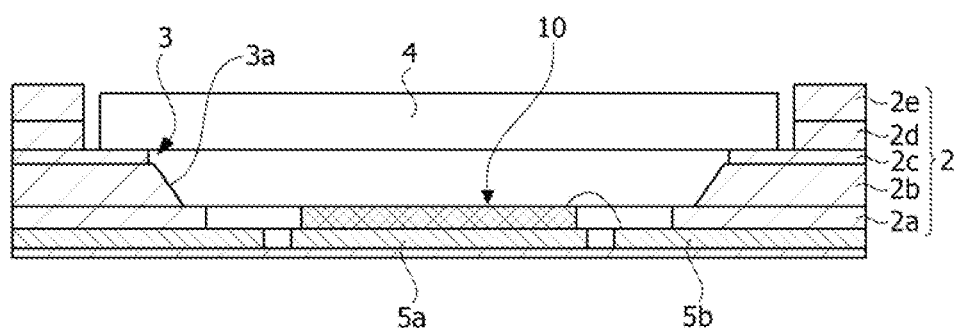

SEMICONDUCTOR DEVICE WITH AN ARRANGEMENT OF RECESSES FOR RECEIVING ELECTRODES

CROSS REFERENCE TO RELATED APPLICATIONS

This application is the National Phase of PCT International Application No. PCT/KR2019/008831, filed on Jul. 17, 2019, which claims priority under 35 U.S.C. 119(a) to Patent Application No. 10-2018-0083562, filed in the Republic of Korea on Jul. 18, 2018, all of which are hereby expressly incorporated by reference into the present application.

TECHNICAL FIELD

An embodiment relates to a semiconductor device.

BACKGROUND ART

A semiconductor device including a compound such as GaN, AlGaN, or the like has many advantages such as having wide and easily adjustable band gap energy, and thus can be variously used as a light emitting device, a light receiving device, various diodes, and the like.

Specifically, a light emitting device such as a light emitting diode or laser diode using group III-V or II-VI compound semiconductor materials can implement various colors such as red, green, blue, ultraviolet rays, and the like through the development of thin film growth technology and device materials, can implement white light with good efficiency by using fluorescent materials or combining colors, and has advantages of low power consumption, semi-permanent lifespan, quick response time, safety, environmental friendliness, and the like in comparison with conventional light sources such as a fluorescent lamp, an incandescent lamp, and the like.

In addition, when a light receiving device such as a photodetector or solar cell is also manufactured using group III-V or II-VI compound semiconductor materials, due to the development of device materials, light in various wavelength ranges from a gamma ray range to a radio wavelength range can be used by absorbing light in various wavelength ranges and generating a photocurrent. In addition, the light receiving device has advantages of quick response time, safety, environmental friendliness, and easy adjustment of the device materials, and thus can be easily used for power control, ultra-high frequency circuits, or communication modules.

Accordingly, application of the semiconductor device is being expanded to a transmission module of an optical communication means, a light emitting diode backlight replacing a cold cathode fluorescence lamp (CCFL) that constitutes a backlight of a liquid crystal display (LCD) device, a white light emitting diode lighting device capable of replacing a fluorescent or an incandescent bulb, car headlights, traffic lights, a sensor which senses gas or fire, and the like. Further, the application of the semiconductor device can be expanded to a high frequency application circuit, other power control devices, and a communication module.

Specifically, an ultraviolet light emitting device can be used for curing, medical, and sterilizing purposes by performing a curing or sterilizing action. Further, since exhaust gas of a vehicle absorbs light of a wavelength of 230 nm, the ultraviolet light emitting device can also be used for a gas sensor.

However, in order to generate light in the ultraviolet wavelength band, since an aluminum composition increases, there is a problem in that current dispersion efficiency is lowered. Accordingly, there is a problem in that light emitting efficiency is lowered at a side surface of a semiconductor structure.

DISCLOSURE

Technical Problem

An embodiment is directed to providing a semiconductor device having excellent current dispersion efficiency.

Further, an embodiment is directed to providing a semiconductor device with improved emission uniformity.

In addition, an embodiment is directed to providing a semiconductor device having excellent optical output.

Problems to be solved by the present invention are not limited to the above-described problems, and purposes and effects understood from the solutions and embodiments which will be described below are also included.

Technical Solution

One aspect of the present invention provides a semiconductor device including: a semiconductor structure including a first conductive semiconductor layer, an active layer, a second conductive semiconductor layer, and a plurality of first recesses and second recesses passing through the second conductive semiconductor layer and the active layer to be disposed up to a partial region of the first conductive semiconductor layer; a first electrode disposed in each of the first recess and the second recess to be electrically connected to the first conductive semiconductor layer; and a second electrode electrically connected to the second conductive semiconductor layer, wherein the first conductive semiconductor layer, the active layer, the second conductive semiconductor layer include aluminum, the number of closest recesses in the plurality of second recesses is fewer than the number of the plurality of first recesses, and the plurality of second recesses include a plurality of recesses, each having an area larger than that of each of the plurality of first recesses.

An area ratio of the first recess and the second recess may be 1:1.2 to 1:2.

A closed-loop which connects centers of the closest second recesses among the plurality of second recesses may surround the plurality of first recesses.

The semiconductor device may include an electrode pad electrically connected to the second electrode.

The semiconductor structure may include a first side surface and a third side surface facing each other, a second side surface and a fourth side surface facing each other, a first edge portion configured to connect the first side surface and the second side surface, a second edge portion configured to connect the second side surface and the third side surface, a third edge portion configured to connect the third side surface and the fourth side surface, and a fourth edge portion configured to connect the fourth side surface and the first side surface, and at least one of the third edge portion and the fourth edge portion may include a concave portion facing the electrode pad.

The second recesses may include a plurality of first outer recesses disposed along the first side surface, a plurality of second outer recesses disposed along the second side surface, a plurality of third outer recesses disposed along the third side surface, a plurality of fourth outer recesses disposed along the fourth side surface, and a plurality of fifth outer recesses disposed along the concave portion, the plurality of first outer recesses may have different shortest distances from the first side surface, the plurality of second outer recesses may have the same shortest distance from the second side surface, the plurality of third outer recesses may have different shortest distances from the third side surface, the plurality of fourth outer recesses may have the same shortest distance from the fourth side surface, and the plurality of fifth outer recesses may have different shortest distances from the concave portion.

Sizes of the first outer recess and the third outer recess may be larger than those of the second outer recess and the fourth outer recess.

The semiconductor structure may include a first side surface and a third side surface facing each other, and a second side surface and a fourth side surface facing each other, the second recesses may include a plurality of first outer recesses disposed along the first side surface, a plurality of second outer recesses disposed along the second side surface, a plurality of third outer recesses disposed along the third side surface, and a plurality of fourth outer recesses disposed along the fourth side surface, and the plurality of first outer recesses and the plurality of third outer recesses may have larger areas than the plurality of second outer recesses and the plurality of fourth outer recesses.

The semiconductor structure may include a first side surface and a third side surface facing each other, and a second side surface and a fourth side surface facing each other, the second recesses may include a plurality of first outer recesses disposed along the first side surface, a plurality of second outer recesses disposed along the second side surface, a plurality of third outer recesses disposed along the third side surface, and a plurality of fourth outer recesses disposed along the fourth side surface, and the plurality of second outer recesses and the plurality of fourth outer recesses may have larger areas than the plurality of first outer recesses and the plurality of third outer recesses.

The emission intensity of a region between virtual lines which extend the plurality of second recesses and the semiconductor structure may be 80% or more of the emission intensity of an inner region of the virtual lines, and the plurality of second recesses may be connected to each other along side surfaces of the semiconductor structure.

Each of the plurality of second recesses may have an oval shape.

Another aspect of the present invention provides a semiconductor device including a semiconductor structure including a first conductive semiconductor layer, an active layer, a second conductive semiconductor layer, and a plurality of recesses passing through the second conductive semiconductor layer and the active layer to be disposed up to a partial region of the first conductive semiconductor layer; a first electrode disposed in each of the plurality of recesses to be electrically connected to the first conductive semiconductor layer; and a second electrode electrically connected to the second conductive semiconductor layer, wherein the first conductive semiconductor layer, the active layer, the second conductive semiconductor layer include aluminum, the plurality of recesses include a plurality of first recesses each having a first area and a plurality of third recesses each having a second area smaller than the first area, and adjacent first recesses among the plurality of first recesses have areas corresponding to each other, and the third recess is disposed between a side surface of the semiconductor structure and the first recess which is the closest to the side surface of the semiconductor structure among the plurality of first recesses.

A minimum interval between the plurality of third recesses may be smaller than a minimum interval between the plurality of first recesses.

The second electrode may be disposed between the plurality of second recesses and the side surface of the semiconductor structure.

An area of the plurality of recesses may be 20% or more of a maximum area of the semiconductor structure.

The number of recesses may be 70 or more.

Diameters of the plurality of first recesses may range from 38 μm to 60 μm.

Advantageous Effects

According to an embodiment, emission intensity at side surfaces of a semiconductor device can be improved.

Further, emission uniformity of the semiconductor device can be improved.

Various useful advantages and effects of the present invention are not limited to the above and can be relatively easily understood in a process of describing exemplary embodiments of the present invention.

DESCRIPTION OF DRAWINGS

FIGS. 2A and 2B are views for describing a configuration in which optical output is enhanced according to a change in the number of recesses.

FIG. 2C is a graph in which emission intensity of the semiconductor device is measured by changing the number of recesses.

FIG. 2D is a graph in which an operating voltage of the semiconductor device is measured by changing the number of recesses.

FIG. 3 is a plan view of the semiconductor device according to the first embodiment of the present invention.

FIG. 4 is a plan view of a semiconductor device according to a second embodiment of the present invention.

FIG. 5A is a plan view of a semiconductor device according to a third embodiment of the present invention.

FIG. 5B is a first modified example of FIG. 5A.

FIG. 5C is a second modified example of FIG. 5A.

FIG. 6 is a plan view of a semiconductor device according to a fourth embodiment of the present invention.

FIG. 7 is a plan view of a semiconductor device according to a fifth embodiment of the present invention.

FIG. 8 is a plan view of a semiconductor device according to a sixth embodiment of the present invention.

FIG. 9 is a plan view of a semiconductor device according to a seventh embodiment of the present invention.

FIG. 10 is a plan view of a semiconductor device according to an eighth embodiment of the present invention.

FIG. 12 is a plan view of the semiconductor device according to the ninth embodiment of the present invention.

FIG. 13 is a plan view of a semiconductor device according to a tenth embodiment of the present invention.

FIG. 14 is a plan view of a semiconductor device according to an eleventh embodiment of the present invention.

FIG. 15 is a plan view of a semiconductor device according to a twelfth embodiment of the present invention.

FIG. 16 is a plan view of a semiconductor device according to a thirteenth embodiment of the present invention.

FIG. 17 is a conceptual diagram of a semiconductor device package according to one embodiment of the present invention.

MODES OF THE INVENTION

Figure 1:
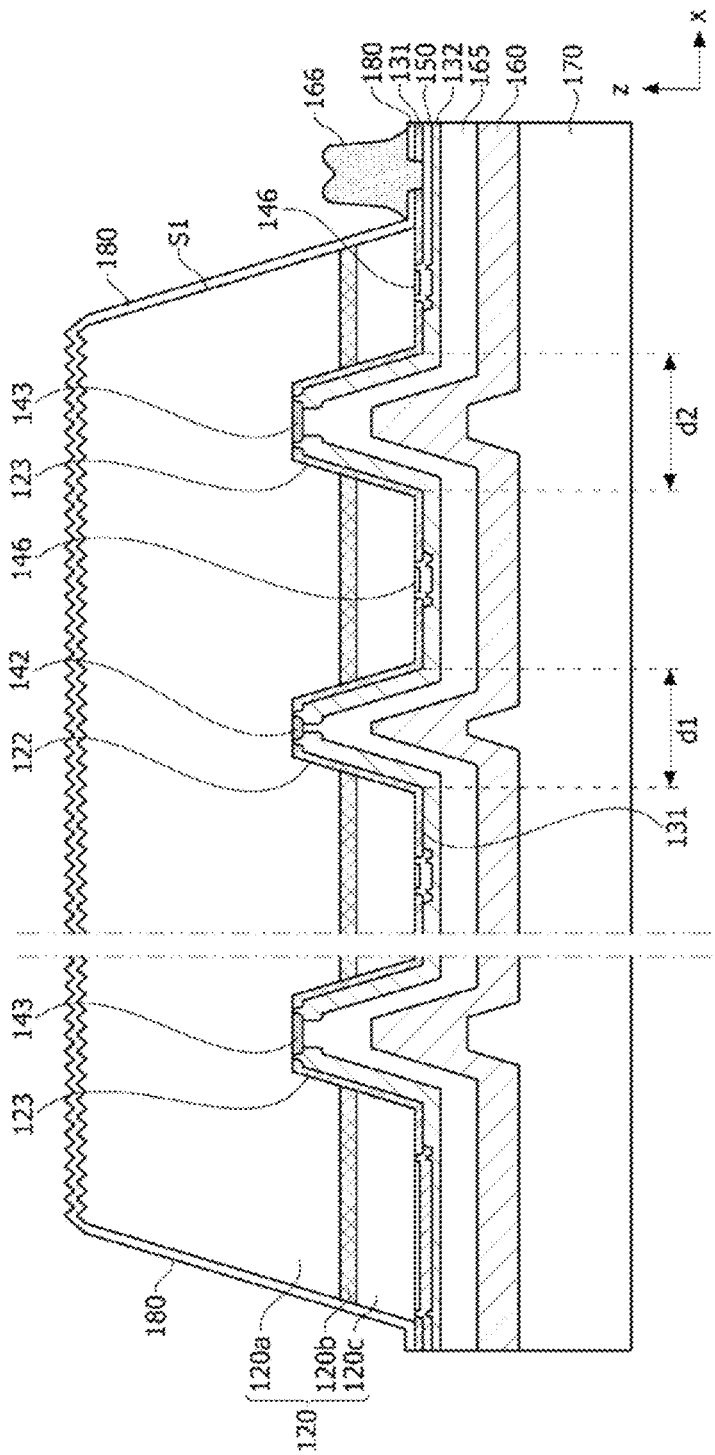
FIG. 1 is a conceptual diagram of a semiconductor device according to a first embodiment of the present invention.

The embodiments may be modified into other forms or some of the embodiments may be combined, and the scope of the present invention is not limited to the embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present invention unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least one other element is disposed between the two elements (indirect contact). Further, when the term "on or under" is expressed, a meaning of not only an upward direction but also a downward direction with respect to one element may be included.

Hereinafter, embodiments of the present invention will be described in detail with reference to the accompanying drawings so that those skilled in the art may easily carry out the embodiment of the present invention.

A semiconductor structure according to an embodiment of the present invention may emit light in an ultraviolet wavelength band. For example, the semiconductor structure may emit light in a near ultraviolet wavelength band (ultraviolet (UV)-A), may emit light in a far ultraviolet wavelength band (UV-B), and may emit light in a deep ultraviolet wavelength band (UV-C). The wavelength band may be determined by a composition ratio of Al in the semiconductor structure.

For example, the light in the near ultraviolet wavelength band (UV-A) may have a peak wavelength in a range from 320 nm to 420 nm, the light in the far ultraviolet wavelength band (UV-B) may have a peak wavelength in a range from 280 nm to 320 nm, and the light in the deep ultraviolet wavelength band (UV-C) may have a peak wavelength in a range from 100 nm to 280 nm.

When the semiconductor structure emits the light in the ultraviolet wavelength band, each layer of the semiconductor structure 120 may have a composition of $In_{x1}Al_{y1}Ga_{1-x1-y1}N$ ($0 \Leftarrow x1 \Leftarrow 1$, $0 < y1 \Leftarrow 1$, and $0 \Leftarrow x1+y1 \Leftarrow 1$) including aluminum. Here, the composition of Al may be represented as a ratio of a total atomic weight including an atomic weight of In, an atomic weight of Ga, and an atomic weight of Al. For example, when the Al composition is 40%, the composition of Ga may be 60%, and this composition ratio may be expressed as $Al_{40}Ga_{60}N$.

Further, in a description of the embodiment, a meaning in which the composition is low or high may be understood as a difference of the composition % (% points) of semiconductor layers. For example, when the aluminum composition of a first semiconductor layer is 30% and the aluminum composition of a second semiconductor layer is 60%, the aluminum composition of the second semiconductor layer may be expressed to be 30% higher than that of the first semiconductor layer.

FIG. 1 is a conceptual diagram of a semiconductor device according to a first embodiment of the present invention.

Referring to FIG. 1, the semiconductor device according to the embodiment includes a semiconductor structure 120 including a first conductive semiconductor layer 120a, an active layer 120b, a second conductive semiconductor layer 120c, and a plurality of recesses 122 and 123 passing through the second conductive semiconductor layer 120c and the active layer 120b to be disposed up to a partial region of the first conductive semiconductor layer 120a, first electrodes 142 and 143 disposed in the plurality of recesses 122 and 123 to be electrically connected to the first conductive semiconductor layer 120a, and a second electrode 146 electrically connected to the second conductive semiconductor layer 120c.

The first conductive semiconductor layer 120a may be implemented with a group III-V or II-VI compound semiconductor, and may be doped with a first dopant. The first conductive semiconductor layer 120a may be selected from semiconductor materials having a composition formula of $In_{x1}Al_{y1}Ga_{1-x1-y1}N$ ($0 \Leftarrow x1 \Leftarrow 1$, $0 < y1 \Leftarrow 1$, and $0 \Leftarrow x1+y1 \Leftarrow 1$), for example, AlGaN, InGaN, InAlGaN, and the like. Further, the first dopant may be an n-type dopant such as Si, Ge, Sn, Se, and Te. When the first dopant is an n-type dopant, the first conductive semiconductor layer 120a doped with the first dopant may be an n-type semiconductor layer.

The active layer 120b is a layer in which electrons (or holes) injected through the first conductive semiconductor layer 120a and holes (or electrons) injected through the second conductive semiconductor layer 120c meet. As the electrons and the holes recombine in the active layer 120b, the electrons transition to a low energy level, and light having a wavelength corresponding to the low energy level may be generated.

The active layer 120b may have one structure among a single well structure, a multiple well structure, a single quantum well structure, a multi quantum well (MQW) structure, a quantum dot structure, and a quantum wire structure, and the structure of the active layer 120b is not limited thereto. The active layer 120b may include Al.

The second conductive semiconductor layer 120c may be formed on the active layer 120b, may be implemented with a group III-V or II-VI compound semiconductor, and may be doped with a second dopant. The second conductive semiconductor layer 120c may be formed of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$), or a material selected from AlGaN, AlInN, AlGaAs, GaP, GaAs, GaAsP, and AlGaInP. When the second dopant is a p-type dopant such as Mg, Zn, Ca, Sr, Ba, or the like, the second conductive semiconductor layer 120c doped with the second dopant may be a p-type semiconductor layer.

The first electrodes 142 and 143 may be disposed on inner upper surfaces of the recesses 122 and 123, respectively, to be electrically connected to the first conductive semiconductor layer 120a. The second electrode 146 may be disposed on a lower surface of the second conductive semiconductor layer 120c.

The first electrodes 142 and 143 and the second electrode 146 may be ohmic electrodes. The first electrodes 142 and 143 and the second electrode 146 may be formed by including at least one of indium tin oxide (ITO), indium zinc oxide (IZO), indium zinc tin oxide (IZTO), indium aluminum zinc oxide (IAZO), and indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au or Ni/$IrO_x$/Au/ITO, Ag, Ni, Cr, Ti, Al, Rh, Pd, Ir, Sn, In, Ru, Mg, Zn, Pt, Au, and Hf, but are not limited to these materials.

An electrode pad 166 may be disposed in a corner region of one side of the semiconductor device. The electrode pad 166 may have a recessed center portion and thus an upper surface thereof may have a concave portion and a convex portion. A wire (not shown) may be bonded to the concave portion of the upper surface. Accordingly, since an adhesive area is widened, the electrode pad 166 and the wire may be more solidly bonded. Since a first insulating layer 131 may be partially opened under the electrode pad 166, a second conductive layer 150 and the second electrode 146 may be electrically connected.

The electrode pad 166 may be made of a conductive material. The electrode pad 166 may have a single layer or multilayer structure, and may include titanium (Ti), nickel (Ni), silver (Ag), and gold (Au). For example, the electrode pad 166 may have a structure of Ti/Ni/Ti/Ni/Ti/Au.

The second electrode 146 may also be disposed between the outermost recesses 122 and 123 and a side surface S1 of the semiconductor structure 120. Accordingly, a current may be dispersed up to a region of the side surface S1 of the semiconductor structure to emit light.

A passivation layer 180 may be formed on upper and side surfaces of the semiconductor structure 120. The passivation layer 180 may come into contact with the first insulating layer 131 in a region adjacent to the second electrode 146 or under the second electrode 146.

When the Al composition of the semiconductor structure increases, a current dispersion characteristic in the semiconductor structure may deteriorate. Further, an amount of light emitted from the active layer 120b to the side surface increases compared to a blue light emitting device based on GaN (TM mode). This TM mode may occur in an ultraviolet semiconductor device.

According to the embodiment, for current dispersion, the first electrodes 142 and 143 may be disposed by forming a relatively large number of recesses 122 and 123 compared to a general GaN semiconductor.

The first insulating layer 131 may electrically insulate the first electrodes 142 and 143 from the active layer 120b and the second conductive semiconductor layer 120c. Further, the first insulating layer 131 may electrically insulate the second electrode 146 and the second conductive layer 150 from a first conductive layer 165.

The first insulating layer 131 may be formed by selecting at least one from the group consisting of $SiO_2$, $SiO_x$, $Si_3N_4$, $Si_xN_y$, $SiO_xN_y$, $Al_2O_3$, $TiO_2$, AlN, and the like, but is not limited thereto. The first insulating layer 131 may be formed as a single layer or multiple layers. For example, the first insulating layer 131 may be a distributed Bragg reflector (DBR) having a multilayer structure including Si oxide or a Ti compound. However, the present invention is not necessarily limited thereto, and the first insulating layer 131 may include various reflective structures.

When the first insulating layer 131 performs a reflection function, the light emitted from the active layer 120b to the side surface may be reflected upward to improve light extraction efficiency. As described later, as the number of recesses 122 and 123 increases, the light extraction efficiency may be more effective.

The second conductive layer 150 may cover the second electrode 146. Accordingly, the electrode pad 166, the second conductive layer 150, and the second electrode 146 may form one electrical channel.

The second conductive layer 150 may completely surround the second electrode 146 and come into contact with side and upper surfaces of the first insulating layer 131. The second conductive layer 150 may be formed of a material having good adhesion with the first insulating layer 131, may be formed of at least one material selected from the group consisting of materials such as Cr, Al, Ti, Ni, Au, and the like, or an alloy thereof, and may be formed as a single layer or a plurality of layers.

When the second conductive layer 150 comes into contact with the side and upper surfaces of the first insulating layer 131, thermal and electrical reliability of the second electrode 146 may be improved. Further, the second conductive layer 150 may have a reflection function of reflecting light emitted between the first insulating layer 131 and the second electrode 146 upward.

The second conductive layer 150 may be Schottky bonded to the second conductive semiconductor layer 126 through a separation space between the first insulating layer 131 and the second electrode 146. Accordingly, current dispersion may be facilitated.

A second insulating layer 132 may electrically insulate the second electrode 146 and the second conductive layer 150 from the first conductive layer 165. The first conductive layer 165 may be electrically connected to the first electrodes 142 and 143 through the second insulating layer 132.

The second conductive layer 150 may electrically connect the second electrode 146 and the electrode pad 166.

The first conductive layer 165 may be electrically connected to the plurality of first electrodes 142 and 143 through the first insulating layer 131 and the second insulating layer 132. The first conductive layer 165 may be made of a material having excellent reflectance. For example, the first conductive layer 165 may include aluminum.

The first conductive layer 165 may serve to upwardly reflect the light emitted from the active layer 120b toward a substrate 170 to enhance light extraction efficiency when including aluminum.

A bonding layer 160 may include a conductive material. For example, the bonding layer 160 may include a material selected from the group consisting of gold, tin, indium, aluminum, silicon, silver, nickel, and copper, or an alloy thereof.

The substrate 170 may be formed of a conductive material. For example, the substrate 170 may include a metal material or a semiconductor material. The substrate 170 may be a metal having excellent electrical conductivity and/or thermal conductivity. In this case, heat generated during the operation of the semiconductor device may be quickly dissipated to the outside.

The substrate 170 may include a material selected from the group consisting of silicon, molybdenum, silicon, tungsten, copper, and aluminum, or an alloy thereof.

An unevenness may be formed on the upper surface of the semiconductor structure. This unevenness may enhance the extraction efficiency of light emitted from the semiconductor structure. The unevenness may have different average heights depending on the UV wavelength, and in the case of UV-C, light extraction efficiency may be enhanced when the height is approximately 300 nm to 800 nm and the average height is approximately 500 nm to 600 nm.

FIGS. 2A and 2B are views for describing a configuration in which optical output is enhanced according to a change in the number of recesses, FIG. 2C is a graph in which the emission intensity of the semiconductor device is measured by changing the number of recesses, and FIG. 2D is a graph in which an operating voltage of the semiconductor device is measured by changing the number of recesses.

Referring to FIG. 2A, when the Al composition of the semiconductor structure 120 increases, a current dispersion characteristic may deteriorate. Accordingly, a current is distributed only at a point adjacent to each of the first electrodes 142 and 143, and current density may rapidly decrease at a distant point. Accordingly, an effective light emitting region P2 may be reduced.

The effective light emitting region P2 may be defined as a region up to a boundary point where the current density is 40% or less based on current density in the first electrodes 142 and 143 having the highest current density. Further, the effective light emitting region P2 may be defined as a region which is 2 to 5 times a diameter of each of the first electrodes 142 and 143. For example, a distance of 5 μm to 40 μm from a center of the first recess 122 may be defined as the boundary point. However, the effective light emitting region P2 may vary depending on a level of an injected current and the composition of Al.

A low current density region P3 outside the effective light emitting regions P2 has a low current density and thus may hardly contribute to light emission. Accordingly, in the ultraviolet semiconductor device, it is possible to enhance optical output by further disposing many first electrodes 142 and 143 in the low current density region P3 having a low current density.

In the case of FIG. 2B, it can be seen that an area of the low current density region P3 between the recesses 122 has been further reduced due to an increase in the number of first electrodes 142 and 143. Generally, in the case of a GaN semiconductor layer, since the current dispersion characteristic is relatively excellent, it is preferable to minimize areas of the recesses 122 and the first electrodes 142 and 143. This is because an area of the active layer 120b decreases as the areas of the recesses 122 and the first electrodes 142 and 143 increase.

However, in the case of the embodiment, in order to emit ultraviolet light, the active layer should include Al, and in order to secure crystallinity, the first conductive semiconductor layer and the second conductive semiconductor layer need to contain Al having a high composition.

As a result, there is a problem in that the Al composition of the first and second conductive semiconductor layers increases, and thus resistance increases, and the current diffusion characteristic deteriorates. Accordingly, it may be preferable to increase the number of first electrodes 142 and 143 even when the area of the active layer is sacrificed.

However, when the number of recesses 122 and the number of first electrodes 142 and 143 are too large, since the area of the active layer 120b is reduced, the emission intensity may be lowered and the operating voltage may increase. Accordingly, it is necessary to appropriately adjust the number of recesses 122 in terms of the emission intensity and the operating voltage.

Referring to FIG. 2C, it may be seen that the optical output increases when the number of recesses 122 increases to 96 based on 100% of the optical output when the number of recesses 122 is 79. However, when the number of recesses 122 is increased to 137, it may be seen that the optical output is rather reduced. It is determined that this is because the number of recesses 122 increases and thus the light emitting area is relatively decreased. In this case, diameters of the recesses 122 may be 30 μm to 60 μm, and the diameters of the first electrodes 142 and 143 may be 24 μm to 50 μm.

Referring to FIG. 2D, it may be seen that the operating voltage decreases when the number of recesses 122 increases to 96 based on 100% of the operating voltage when the number of recesses 122 is 79. Further, it may be seen that the operating voltage slightly decreases even when the number of recesses 122 is increased to 116 and 137. It is determined that this is because the number of recesses 122 increases to improve current dispersion efficiency.

Taken together, it may be seen that it is possible to improve the optical output and lower the operating voltage when the recesses 122 are manufactured in a number more than 79 and less than 137.

However, as shown in FIG. 2B, even when the number of recesses increases, since it is difficult to sufficiently dispose the first electrodes at the edge of the semiconductor structure, there is a problem in that the emission intensity is relatively weak. Since current is not injected up to the edge of the semiconductor structure, a low light emitting area DA1 may be partially generated. Accordingly, there may be a problem in that light uniformity deteriorates due to a difference between the emission intensity of the center portion of the structure and the emission intensity of the edge.

FIG. 3 is a plan view of the semiconductor device according to the first embodiment of the present invention, and FIG. 4 is a plan view of a semiconductor device according to a second embodiment of the present invention.

Referring to FIG. 3, the recesses 122 may include a plurality of first recesses 122 in which the number of closest recesses 122 is N, and a plurality of second recesses 123 in which the number of closest recesses 122 is less than N. The second recesses 123 may be recesses closest to side surfaces S1, S2, S3, and S4 of the semiconductor structure 120.

For example, the plurality of first recesses 122 may be surrounded by six closest recesses 122 and 123. That is, distances between the six recesses 122 and 123 forming vertices of a hexagon BL2 and the recess 122 disposed in the hexagon may be the same. However, the present invention is not necessarily limited thereto, and the first recesses 122 may have a structure (for example, a pentagonal structure, or an octagonal structure) surrounded by the 5 or 8 closest recesses. Among the plurality of first recesses 122, the first recesses 122 close to each other may have corresponding areas. The corresponding areas may include completely identical area or slightly different areas. That is, the first recesses 122 close to each other may have different areas due to machining errors and the like.

In the second recesses 123, the number of closest recesses 122 and 123 may be smaller than N. For example, when the number of closest recesses 122 and 123 surrounding the first recess 122 is 6, the second recesses 123 may be surrounded by 2 to 5 recesses 122 and 123. The second recesses 123 may be surrounded by 2 recesses 122 or may be surrounded by 4 recesses 122.

The second recesses 123 may be defined as recesses disposed at the closest positions along the side surfaces S1, S2, S3, and S4 of the semiconductor structure 120. That is, the second recesses 123 may be a set of the recesses 122 disposed at the outermost side of the plurality of recesses 122. Accordingly, since the recesses may not be disposed between the second recesses 123 and the side surfaces S1, S2, S3, and S4 of the semiconductor structure 120, the number of recesses 122 and 123 surrounding the second recesses 123 may be smaller than the number of recesses 122 and 123 surrounding the first recesses 122.

The second recess 123 may have at least one of a diameter and a shape different from that of the first recess 122. The second recess 123 may have a different diameter or a different shape from the first recess 122. Further, both the shape and diameter may be different.

The second recesses 123 close to each other among the plurality of second recesses 123 may have corresponding areas. The corresponding areas may include completely identical area or slightly different areas. That is, the second recesses 123 close to each other may have different areas due to machining errors and the like.

The plurality of second recesses 123 may have a plurality of recesses each having an area larger than an area d1 of the first recess 122. As described above, since the number of recesses 122 around the second recesses 123 is relatively small, the current is not dispersed up to the side surfaces of the semiconductor structure 120 and thus the low light emitting area DA1 may be generated. Accordingly, as areas of the outermost second recess 123 and the first electrode 143 disposed in the second recess 123 are increased, the current may be dispersed up to the side surfaces of the semiconductor structure 120. Also, as described above, since the second electrode is disposed adjacent to the side surface of the semiconductor structure, the emission intensity at the side surface of the semiconductor structure 120 may increase. Further, since the low light emitting area DA1 at the side surface of the semiconductor structure 120 is reduced, light uniformity may also increase.

All of the plurality of second recesses 123 may have areas larger than the area d1 of the first recess 122, but are not limited thereto. For example, only some of the plurality of second recesses 123 may have areas larger than the area d1 of the first recess 122, and other second recesses 123 may have areas equal to or smaller than the area d1 of the first recess 122. That is, the areas of the second recesses may be appropriately adjusted according to positions where the second recesses are disposed.

The emission intensity of an outer region between a closed-loop BL1 connecting centers of the plurality of second recesses 123 by virtual lines and the side surface of the semiconductor structure 120 may be 50% or more of emission intensity of an inner region of the closed-loop BL1.

An area ratio (d1:d2) of the first recess 122 and the second recess 123 may be 1:1.2 to 1:2. When the area ratio is 1:1.2 or more, since the area of the first electrode 142 disposed in the second recess 123 is widened, the current may be dispersed up to the side surface of the semiconductor structure 120 to emit light. Further, when the area ratio is smaller than 1:2, a case in which the area of the second recess 123 becomes too wide and thus a light emitting area decreases may be prevented.

Since the area of the second recess 123 is larger than the area of the first recess 122, the area of the first electrode 143 per unit area at an outer region of the closed-loop BL1 may be larger than the area of the first electrode 142 per unit area at an inner region of the closed-loop BL1. Accordingly, since current dispersion in the outer region is improved, the emission intensity may be enhanced.

The semiconductor structure 120 may include includes a first side surface S1 and a third side surface S3 facing each other in a plan view, a second side surface S2 and a fourth side surface S4 facing each other in a plan view, a first edge portion V1 which connects the first side surface S1 and the second side surface S2, a second edge portion V2 which connects the second side surface S2 and the third side surface S3, a third edge portion V3 which connects the third side surface S3 and the fourth side surface S4, and a fourth edge portion V4 which connects the fourth side surface S4 and the first side surface S1.

In this case, at least one of the third edge portion V3 and the fourth edge portion V4 may include a concave portion facing the electrode pad 166. In the embodiment, an example in which the concave portion is formed in each of the third edge portion V3 and the third edge portion V3 is described, but the concave portion may be formed only in one of the third edge portion V3 and the fourth edge portion V4.

For example, as shown in FIG. 4, the concave portion may be formed only in the fourth edge portion V4.

In order to increase the number of recesses 122 and 123 and the number of first electrodes 142 and 143, it may be advantageous to have only one electrode pad 166. However, when only one electrode pad 166 is disposed, since an area of the pad is relatively small, current dispersion efficiency may decrease. Further, since resistance increases, current injection efficiency may decrease when a high current is applied.

The current injection efficiency may be defined as a ratio of an amount reaching the active layer among the total amount of current applied to an optical device from the outside, but is not necessarily limited thereto. That is, the number of electrode pads 166 may be appropriately adjusted according to characteristics and use of the corresponding semiconductor device.

The second recesses 123 may include a plurality of first outer recesses 123a disposed along the first side surface S1, a plurality of second outer recesses 123b disposed along the second side surface S2, a plurality of third outer recesses 123c disposed along the third side surface S3, a plurality of fourth outer recesses 123d disposed along the fourth side surface S4, and a plurality of fifth outer recesses 123e disposed along the concave portion.

In this case, the plurality of first outer recesses 123a may have different shortest distances from the first side surface S1, the plurality of second outer recesses 123b may have the same shortest distance from the second side surface S2, the plurality of third outer recesses 123c may have different shortest distances from the third side surface S3, the plurality of fourth outer recesses 123d may have the same shortest distance from the fourth side surface S4, and the plurality of fifth outer recesses 123e may have different shortest distances from the concave portion.

In the embodiment, the first outer recesses 123a and the third outer recesses 123c may be disposed in a zigzag manner in a first direction (an X-axis direction). On the other hand, the second outer recesses 123b and the fourth outer recesses 123d may be disposed parallel to the side surface of the semiconductor structure 120 in a second direction (a Y-axis direction).

FIG. 5A is a plan view of a semiconductor device according to a third embodiment of the present invention, FIG. 5B is a first modified example of FIG. 5A, and FIG. 5C is a second modified example of FIG. 5A.

Referring to FIG. 5A, areas d2 of the first outer recess 123a and the third outer recess 123c may be larger than areas d3 of the second outer recess 123b and the fourth outer recess 123d. The first outer recesses 123a and the third outer recesses 123c may be a set of recesses 123-1 having a first area, and the second outer recesses 123b and the fourth outer recesses 123d may be a set of recesses 123-2 having a second area. Accordingly, an area of a first electrode 143-1 disposed in the recess 123-1 having the first area may be larger than an area of a first electrode 143-1 disposed in the recess 123-2 having the second area.

Since an interval between the first outer recesses 123a is wider than an interval between the second outer recesses 123b, the area d2 of the first outer recess 123a may be formed larger than the area d3 of the second outer recess 123b to compensate for this. Similarly, the area d2 of the third outer recess 123c may be larger than the area d2 of the fourth outer recess 123d.

That is, the first outer recesses 123a with a relatively wide interval have a wide diameter to disperse the current to the side surface of the semiconductor structure 120, and the second outer recesses 123b with a relatively narrow interval may have a small diameter to prevent an unnecessary reduction of the light emitting area.

An area ratio (d1:d2) of the first recess 122 and the first outer recess 123a may be 1:1.4 to 1:2.0. When the area ratio (d1:d2) is greater than 1:1.4, since the area of the first outer recess 123a increases, the current may be dispersed up to the side surface of the semiconductor structure 120. Further, when the area ratio (d1:d2) is less than 1:2.0, a case in which the area of the first outer recess 123a is too large and thus the light emitting area is excessively reduced may be prevented.

An area ratio (d1:d3) of the first recess 122 and the second outer recess 123b may be 1:1.2 to 1:1.4. When the area ratio (d1:d3) is greater than 1:1.2, since the area of the second outer recess 123b increases, the current may be dispersed up to the side surface of the semiconductor structure 120. Further, when the area ratio (d1:d3) is less than 1:1.4, a case in which the area of the second outer recess 123b is too large and thus the light emitting area is excessively reduced may be prevented.

Referring to FIG. 5B, the semiconductor structure 120 may include a first side surface S1 and a third side surface S3 facing each other, and a second side surface S2 and a fourth side surface S4 facing each other. In this case, a concave portion corresponding to a shape of the electrode pad 166 may be formed between the first side surface S1 and the fourth side surface S4 and/or between the third side surface S3 and the fourth side surface S4.

The second recesses 123 may include a plurality of first outer recesses 123a disposed along the first side surface S1, a plurality of second outer recesses 123b disposed along the second side surface S2, a plurality of third outer recesses 123c disposed along the third side surface S3, and a plurality of fourth outer recesses 123d disposed along the fourth side surface S4. The first to fourth outer recesses 123a, 123b, 123c, and 123d may be defined as recesses respectively disposed closest to the side surfaces of the semiconductor structure 120.

In this case, the plurality of first outer recesses 123a and the plurality of third outer recesses 123c may have larger areas than the plurality of second outer recesses 123b and the plurality of fourth outer recesses 123d.

For example, a separation interval between the plurality of first outer recesses 123a in in the first direction (the X-axis direction) may be larger than a separation interval between the plurality of second outer recesses 123b in the second direction (the Y-axis direction).

That is, the plurality of first outer recesses 123a are relatively farther apart than the plurality of second outer recesses 123b, and thus may have a larger area to increase a current dispersion region.

In this case, the areas of the plurality of second outer recesses 123b and the plurality of fourth outer recesses 123d may be the same as the area of the first recess 122, but are not limited thereto.

Referring to FIG. 5C, the semiconductor structure 120 may include a first side surface S1 and a third side surface S3 facing each other, and a second side surface S2 and a fourth side surface S4 facing each other. In this case, a concave portion corresponding to a shape of the electrode pad 166 may be formed between the first side surface S1 and the fourth side surface S4 and/or between the third side surface S3 and the fourth side surface S4.

The second recesses may include a plurality of first outer recesses 123a disposed along the first side surface S1, a plurality of second outer recesses 123b disposed along the second side surface S2, a plurality of third outer recesses 123c disposed along the third side surface S3, and a plurality of fourth outer recesses 123d disposed along the fourth side surface S4.

In this case, the disposition of the recesses in FIG. 5C may be different from the disposition of the recesses in FIG. 5B. For example, in FIG. 5B, the fourth outer recesses 123d disposed between the electrode pads 166 are more densely disposed than the first outer recesses 123a, whereas in FIG. 5C, an interval between the fourth outer recesses 123d disposed between the electrode pads 166 may be wider than an interval between the first outer recesses 123a.

Accordingly, in this case, the plurality of second outer recesses 123b and the plurality of fourth outer recesses 123d may have larger areas than the plurality of first outer recesses 123a and the plurality of third outer recesses 123c. For example, a separation interval between the plurality of fourth outer recesses 123d in the second direction (the Y-axis direction) may be larger than a separation interval between the plurality of first outer recesses 123a in the first direction (the X-axis direction).

That is, the plurality of fourth outer recesses 123d are relatively farther apart than the plurality of first outer recesses 123a, and thus may have larger areas to disperse the current more widely.

In this case, the areas of the plurality of first outer recesses 123a and the plurality of third outer recesses 123c may be the same as the area of the first recess 122, but are not limited thereto.

FIG. 6 is a plan view of a semiconductor device according to a fourth embodiment of the present invention, FIG. 7 is a plan view of a semiconductor device according to a fifth embodiment of the present invention, FIG. 8 is a plan view of a semiconductor device according to a sixth embodiment of the present invention, and FIG. 9 is a plan view of a semiconductor device according to a seventh embodiment of the present invention.

Referring to FIG. 6, a shape of the second recess 123 may be different from a shape of the first recess 122. For example, the second recess 123 may have an oval shape. In this case, since current injection efficiency up to the adjacent region may increase, a light emitting area may be widened. However, the shape of the second recess 123 is not necessarily limited thereto, and the shape of the second recess 123 may be appropriately modified to increase a current injection area.

Referring to FIG. 7, the semiconductor device according to the embodiment may include all the structures described in FIG. 1. The plurality of recesses 122 may include first and second recesses 122 and 123 having a first area and a third recess 124 having a second area smaller than the first area.

The plurality of recesses 122 may be defined as recesses in which the number of closest recesses 122 of the first area is N, and the plurality of second recesses 123 may be defined as recesses in which the number of closest recesses 122 of the first area is less than N.

For example, the first recesses 122 may be surrounded by six closest recesses 122 and 123. The closest recesses 122 and 123 may have the same diameter as the first recess 122. That is, distances between the six recesses 122 and 123 forming vertices of a hexagon and the recess 122 disposed in the hexagon may be the same. However, the present invention is not necessarily limited thereto, and the first recesses 122 may have a structure (for example, a pentagonal structure, or an octagonal structure) surrounded by 5 or 8 closest recesses 122 and 123.

In the second recesses 123, the number of closest recesses 122 and 123 may be smaller than N. The closest recesses 122 and 123t may have the same diameter as the first recesses 122 and the second recesses 123. That is, the third recess 124 has a different diameter, and thus may be excluded from the closest recesses.

For example, when the number of closest recesses 122 and 123 surrounding the first recesses 122 is 6, the second recesses 123 may be surrounded by 2 to 5 recesses 122 and 123. The second recesses 123 may be surrounded by 2 recesses 122 and 123 or may be surrounded by 4 recesses 122 and 123.

The third recesses 124 may be disposed between the plurality of second recesses 123. The third recesses 124 may be disposed outside a closed-loop BL1 which connects centers of the plurality of second recesses 123. Since the plurality of first recesses 122 are densely disposed inside the closed-loop BL1, emission intensity may be relatively strong. Accordingly, the third recesses 124 may be disposed outside the closed-loop BL1 where emission intensity is relatively low.

Since the third recess 124 is formed smaller in size than the diameters of the first recesses 122 and the second recesses 123, the diameter of the first electrode 144 disposed in the third recess 124 may also be smaller than the diameters of the first electrodes 142 and 143 disposed in the first and second recesses 122 and 123.

According to the embodiment, since the third recess 124 is disposed at a point where emission intensity is weak and thus disperses the current, the emission intensity may be improved and overall light uniformity may be improved.

Since the plurality of third recesses 124 are densely disposed in an outer region of the closed-loop BL1, a minimum separation distance of the plurality of third recesses 124 may be smaller than a minimum separation distance of the first recesses 122. Specifically, the third recesses 124 may be disposed most densely in a region (concave portion) facing the electrode pad 166. This may be because a space between the second recess 123 and the side surface of the semiconductor structure may be the widest in the region facing the electrode pad 166.

Referring to FIG. 8, the third recess 124 may have a shape different from those of the first recess 122 and the second recess 123. For example, each of the first recess 122 and the second recess 123 may have a circular shape, while the third recess 124 may have an oval shape.

In still another embodiment, both the third recesses 124 in FIG. 7 and the third recesses 124 in FIG. 8 may be formed on the semiconductor structure 120. That is, the area and shape of the third recess 124 may be appropriately adjusted according to the area and position of the low emission area.

Referring to FIG. 9, a third recess 126 may be continuously formed along the side surfaces of the semiconductor structure 120. According to this structure, since the current is dispersed at the side surface of the semiconductor structure 120 having relatively low emission intensity, light uniformity may be improved. Further, as shown in FIG. 10, a ring-shaped third recess 127 may be divided into a plurality of recesses.

Figure 11:
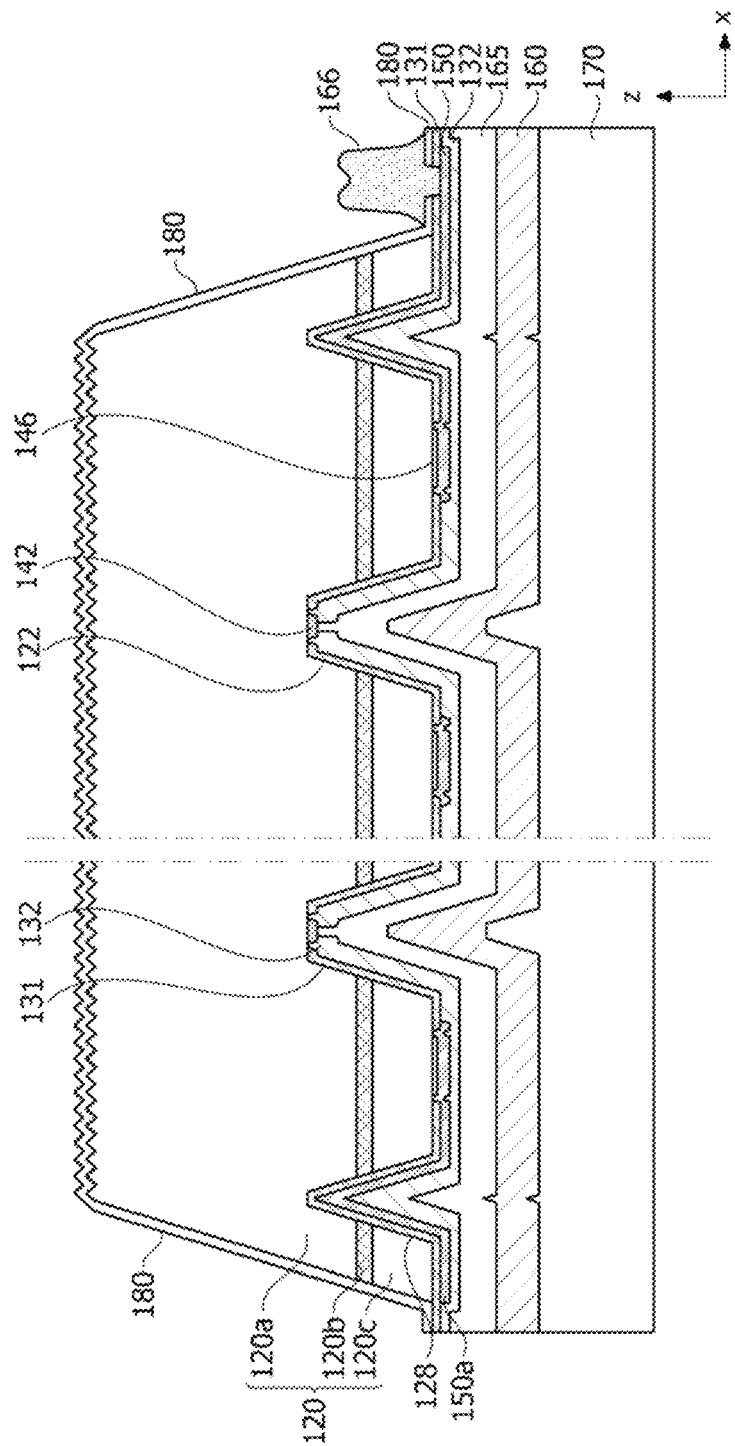
FIG. 11 is a conceptual diagram of a semiconductor device according to a ninth embodiment of the present invention.

FIG. 11 is a conceptual diagram of a semiconductor device according to a ninth embodiment of the present invention, and FIG. 12 is a plan view of the semiconductor device according to the ninth embodiment of the present invention.

Referring to FIG. 11, the semiconductor device according to the embodiment includes a semiconductor structure 120 including a first conductive semiconductor layer 120a, an active layer 120b, a second conductive semiconductor layer 120c, and a plurality of recesses 122 and a trench 128 passing through the second conductive semiconductor layer 120c and the active layer 120b to be disposed up to a partial region of the first conductive semiconductor layer 120a, a first electrode 142 disposed in the plurality of recesses 122 to be electrically connected to the first conductive semiconductor layer 120a, and a second electrode 146 electrically connected to the second conductive semiconductor layer 120c.

All of the structures described in FIG. 1 may be applied to the semiconductor device according to the embodiment except for the trench 128 structure.

A passivation layer 180 surrounding side surfaces and an upper surface of the semiconductor structure 120 may be peeled from the semiconductor structure 120 due to heat generated by the operation of the semiconductor device, external high temperature and high humidity, a difference in thermal expansion coefficient with the semiconductor structure 120, and the like. Alternatively, cracks or the like may occur in the passivation layer 180.

When peeling, cracks, or the like occur in the passivation layer 180, the semiconductor structure 120 may be oxidized by external moisture, contaminants, or the like which penetrate into the semiconductor structure 120 from the outside.

In the case of an ultraviolet light emitting device, since an Al composition in the active layer 126 is relatively high, it may be more susceptible to oxidization. Accordingly, when a sidewall of the semiconductor structure 120 is exposed due to cracks or the like, the active layer 126 is rapidly oxidized and thus optical output may be reduced.

Accordingly, in the semiconductor structure 120 according to the embodiment, the trench 128 surrounding the plurality of recesses 122 may be disposed on the side surface of the semiconductor structure 120. The trench 128 may be continuously formed along the side surface of the semiconductor structure 120 to form a line. Accordingly, since penetration of contaminants into the active layer 120b may be prevented, reliability may be improved.

A width of the trench 128 may be smaller than the diameter of the recess 122. Further, the first electrode may not be disposed in the trench 128. Accordingly, the active layer 120b disposed between the trench 128 and the side surface of the semiconductor structure 120 may not substantially participate in light emission.

An end 150a of the second conductive layer 150 may be spaced apart from a side surface of the chip and may be covered by the second insulating layer 132. Accordingly, since the end of the second conductive layer 150 is blocked from the outside, reliability may be improved.

Referring to FIG. 12, the trench 128 may be continuously formed along the side surface of the semiconductor structure 120. In the trench 128, a region between the side surfaces of the semiconductor structure 120 may be a non-light emitting region which does not actually participate in light emission.

The plurality of recesses 122 may include a plurality of first recesses 122 in which the number of closest recesses 122 is N, and a plurality of second recesses 123 in which the number of closest recesses 122 is less than N. The second recesses 123 may be recesses closest to side surfaces S1, S2, S3, and S4 of the semiconductor structure 120.

For example, the first recesses 122 may be surrounded by six closest recesses 122 and 123. That is, distances between the six recesses 122 and 123 forming vertices of a hexagon BL2 and the recess 122 disposed in the hexagon may be the same. However, the present invention is not necessarily limited thereto, and the first recesses 122 may have a structure (for example, a pentagonal structure, or an octagonal structure) surrounded by 5 or 8 closest recesses.

In the second recesses 123, the number of closest recesses 122 and 123 may be smaller than N. For example, when the number of closest recesses 122 and 123 surrounding the first recess 122 is 6, the second recesses 123 may be surrounded by 2 to 5 recesses 122 and 123. The second recesses 123 may be surrounded by 2 recesses 122 or may be surrounded by 4 recesses 122.

The second recesses 123 may be defined as recesses disposed at the closest positions along the side surfaces S1, S2, S3, and S4 of the semiconductor structure 120. That is, the second recesses 123 may be a set of the recesses 122 disposed at the outermost side of the plurality of recesses 122. Accordingly, since the recesses may not be disposed between the second recesses 123 and the side surfaces S1, S2, S3, and S4 of the semiconductor structure 120, the number of recesses 122 and 123 surrounding the second recesses 123 may be smaller than the number of recesses 122 and 123 surrounding the first recesses 122.

The second recess 123 may have at least one of a diameter and a shape different from that of the first recess 122. The second recess 123 may have a different diameter or a different shape from the first recess 122. Further, both the shape and diameter may be different.

An area d2 of the second recess 123 may be larger than an area d1 of the first recess 122. As described above, since the number of recesses 122 around the second recesses 123 is relatively small, the current is not dispersed up to the side surfaces of the semiconductor structure 120 and thus the low light emitting area DA1 may be generated. Accordingly, as areas of the outermost second recess 123 and the first electrode 143 are increased, the current may be dispersed up to the side surfaces of the semiconductor structure 120. Accordingly, the emission intensity at the side surface of the semiconductor structure 120 may increase. Further, since the low light emitting area DA1 at the side surface of the semiconductor structure 120 is reduced, light uniformity may also increase.

Accordingly, the emission intensity of a region between the closed-loop BL1 extending the plurality of second recesses 123 and the semiconductor structure 120 may be 80% or more of the emission intensity of the inner region of the closed-loop BL1.

An area ratio (d1:d2) of the first recess 122 and the second recess 123 may be 1:1.2 to 1:2. When the area ratio is 1:1.2 or more, since an area of the first electrode 142 disposed in the second recess 123 is widened, the current may be dispersed up to the side surface of the semiconductor structure 120 to emit light. Further, when the area ratio is smaller than 1:2, a case in which an area of the second recess 123 becomes too wide and thus a light emitting area decreases may be prevented.

The semiconductor structure 120 may include includes a first side surface S1 and a third side surface S3 facing each other in a plan view, a second side surface S2 and a fourth side surface S4 facing each other in a plan view, a first edge portion V1 which connects the first side surface S1 and the second side surface S2, a second edge portion V2 which connects the second side surface S2 and the third side surface S3, a third edge portion V3 which connects the third side surface S3 and the fourth side surface S4, and a fourth edge portion V4 which connects the fourth side surface S4 and the first side surface S1.

In this case, at least one of the third edge portion V3 and the fourth edge portion V4 may include a concave portion facing the electrode pad 166. In the embodiment, an example in which the concave portion is formed in each of the third edge portion V3 and the third edge portion V3 is described, but the concave portion may be formed only in one of the third edge portion V3 and the fourth edge portion V4.

For example, as shown in FIG. 13, the concave portion may be formed only in the fourth edge portion V4.

In order to increase the number of recesses 122 and 123 and the number of first electrodes 142 and 143, it may be advantageous to have only one electrode pad 166. However, when only one electrode pad 166 is disposed, since an area of the pad is relatively small, current dispersion efficiency may decrease. Further, since resistance increases, current injection efficiency may decrease when a high current is applied.

The current injection efficiency may be defined as a ratio of an amount reaching the active layer among the total amount of current applied to an optical device from the outside, but is not necessarily limited thereto. That is, the number of electrode pads 166 may be appropriately adjusted according to characteristics and use of the corresponding semiconductor device.

The second recesses 123 may include a plurality of first outer recesses 123a disposed along the first side surface S1, a plurality of second outer recesses 123b disposed along the second side surface S2, a plurality of third outer recesses 123c disposed along the third side surface S3, a plurality of fourth outer recesses 123d disposed along the fourth side surface S4, and a plurality of fifth outer recesses 123e disposed along the concave portion.

In this case, the plurality of first outer recesses 123a may have different shortest distances from the first side surface S1, the plurality of second outer recesses 123b may have the same shortest distance from the second side surface S2, the plurality of third outer recesses 123c may have different shortest distances from the third side surface S3, the plurality of fourth outer recesses 123d may have the same shortest distance from the fourth side surface S4, and the plurality of fifth outer recesses 123e may have different shortest distances from the concave portion.

In the embodiment, the first outer recesses 123a and the third outer recesses 123c may be disposed in a zigzag manner in a first direction. Further, the second outer recesses 123b and the fourth outer recesses 123d may be disposed parallel to the side surface of the semiconductor structure 120 in a second direction.

Referring to FIG. 14, areas d2 of the first outer recess 123a and the third outer recess 123c may be larger than areas d3 of the second outer recess 123b and the fourth outer recess 123d. The first outer recesses 123a and the third outer recesses 123c may be a set of recesses 123-1 having a first area, and the second outer recesses 123b and the fourth outer recesses 123d may be a set of recesses 123-2 having a second area. Accordingly, an area of a first electrode 143-1 disposed in the recess 123-1 having the first area may be larger than an area of a first electrode 143-1 disposed in the recess 123-2 having the second area.

Since an interval between the first outer recesses 123a is wider than an interval between the second outer recesses 123b, the area d2 of the first outer recess 123a may be formed larger than the area d3 of the second outer recess 123b to compensate for this. Similarly, the area d2 of the third outer recess 123c may be larger than the area d2 of the fourth outer recess 123d.

That is, the first outer recesses 123a with a relatively wide interval have a wide diameter to disperse the current up to the side surface of the semiconductor structure 120, and the second outer recesses 123b with a relatively narrow interval may have a small diameter to prevent an unnecessary reduction of the light emitting area.

An area ratio (d1:d2) of the first recess 122 and the first outer recess 123a may be 1:1.4 to 1:2.0. When the area ratio (d1:d2) is greater than 1:1.4, since the area of the first outer recess 123a increases, the current may be dispersed up to the side surface of the semiconductor structure 120. Further, when the area ratio (d1:d2) is less than 1:2.0, a case in which the area of the first outer recess 123a is too large and thus the light emitting area is excessively reduced may be prevented.

An area ratio (d1:d3) of the first recess 122 and the second outer recess 123b may be 1:1.2 to 1:1.4. When the area ratio (d1:d3) is greater than 1:1.2, since the area of the second outer recess 123b increases, the current may be dispersed up to the side surface of the semiconductor structure 120. Further, when the area ratio (d1:d3) is less than 1:1.4, a case in which the area of the second outer recess 123b is too large and thus the light emitting area is excessively reduced may be prevented.

FIG. 15 is a plan view of a semiconductor device according to a twelfth embodiment of the present invention, and FIG. 16 is a plan view of a semiconductor device according to a thirteenth embodiment of the present invention.

Referring to FIG. 15, a shape of the second recess 123 may be different from a shape of the first recess 122. For example, the second recess 123 may have an oval shape. In this case, since current injection efficiency up to the adjacent region may increase, a light emitting area may be widened. However, the shape of the second recess 123 is not necessarily limited thereto, and the shape of the second recess 123 may be appropriately modified to increase a current injection area.

Referring to FIG. 16, the recesses 122 according to the embodiment may include a plurality of first recesses 122 in which the number of closest recesses 122 is N, a plurality of second recesses 123 in which the number of closest recesses 122 is less than N, and a plurality of third recesses 124 disposed between the plurality of second recesses 123.

For example, the first recesses 122 may be surrounded by six closest recesses 122 and 123. The closest recesses 122 and 123 may have the same diameter as the first recess 122. That is, distances between the six recesses 122 and 123 forming vertices of a hexagon and the recess 122 disposed in the hexagon may be the same. However, the present invention is not necessarily limited thereto, and the first recesses 122 may have a structure (for example, a pentagonal structure, or an octagonal structure) surrounded by 5 or 8 closest recesses 122 and 123.

In the second recesses 123, the number of closest recesses 122 and 123 may be smaller than N. The closest recesses 122 and 123 may have the same diameter as the first recesses 122 and the second recesses 123. That is, the third recess 124 has a different diameter, and thus may be excluded from the closest recesses.

For example, when the number of closest recesses 122 and 123 surrounding the first recesses 122 is 6, the second recesses 123 may be surrounded by 2 to 5 recesses 122 and 123. The second recesses 123 may be surrounded by 2 recesses 122 and 123 or may be surrounded by 4 recesses 122 and 123.

The third recesses 124 may be disposed between the plurality of second recesses 123. The third recesses 124 may be disposed outside the closed-loop BL1 which connects centers of the plurality of second recesses 123. Since the plurality of first recesses 122 are densely disposed inside the closed-loop BL1, emission intensity may be relatively strong. Accordingly, the third recesses 124 may be disposed outside the closed-loop BL1 where emission intensity is relatively low.

Since the third recess 124 is formed smaller in size than the diameters of the first recesses 122 and the second recesses 123, the diameter of the first electrode 144 disposed in the third recess 124 may also be smaller than the diameters of the first electrodes 142 and 143 disposed in the first and second recesses 122 and 123.

According to the embodiment, since the third recess 124 is disposed at a point where emission intensity is weak and thus disperses the current, the emission intensity may be improved and overall light uniformity may be improved.

A shape of the third recess 124 may be variously modified. For example, the third recess 124 may have a shape different from those of the first recess 122 and the second recess 123. For example, each of the first recess 122 and the second recess 123 may have a circular shape, while the third recess 124 may have an oval shape.

FIG. 17 is a conceptual diagram of a semiconductor device package according to one embodiment of the present invention.

Referring to FIG. 17, the semiconductor device package may include a body 2 having a groove 3 formed therein, a semiconductor device 1 disposed in the body 2, and a pair of lead frames 5a and 5b disposed in the body 2 and electrically connected to the semiconductor device 1. The semiconductor device 1 may include all of the above-described configurations.

The body 2 may include a material or coating layer which reflects ultraviolet light. The body 2 may be formed by laminating a plurality of layers 2a, 2b, 2c, 2d, and 2e. The plurality of layers 2a, 2b, 2c, 2d, and 2e may be formed of the same material or may include different materials.

The groove 3 may be formed to be wider as a distance from the semiconductor device increases, and a step 3a may be formed on an inclined surface.

A light transmission layer 4 may cover the groove 3. The light transmission layer 4 may be formed of a glass material, but is not limited thereto. The light transmission layer 4 is not particularly limited as long as it is a material capable of effectively transmitting ultraviolet light. The inside of the groove 3 may be an empty space.

The semiconductor device may be applied to various types of light source devices. For example, the light source device may be a concept including a sterilization device, a curing device, a lighting device, a display device, a vehicle lamp, and the like. That is, the semiconductor device may be applied to various electronic devices disposed in a case to provide light.

The sterilization device may sterilize a desired region by including the semiconductor device according to the embodiment. The sterilization device may be applied to household appliances such as a water purifier, an air conditioner, a refrigerator, and the like, but is not limited thereto. That is, the sterilization device may be applied to all various products (for example, a medical device) which require sterilization.

For example, the water purifier may be provided with the sterilization device according to the embodiment to sterilize circulating water. The sterilization device is disposed in a nozzle or an outlet through which the water circulates to irradiate ultraviolet rays. In this case, the sterilization device may include a waterproof structure.

The curing device may cure various types of liquid by including the semiconductor device according to the embodiment. The liquid may be a concept including all various materials which are cured when irradiated with ultraviolet rays. For example, the curing device may cure various types of resins. Alternatively, the curing device may be applied to cure cosmetic products such as a manicure.

The lighting device may include a light source module including a substrate and the semiconductor device of the embodiment, a heat dissipation part which dissipates heat from the light source module, and a power supply part which processes or converts an electrical signal provided from the outside to provide the electrical signal to the light source module. Further, the lighting device may include a lamp, a head lamp, a street light, or the like.

The display device may include a bottom cover, a reflective plate, a light emitting module, a light guide plate, an optical sheet, a display panel, an image signal output circuit, and a color filter. The bottom cover, the reflection plate, the light emitting module, the light guide plate, and the optical sheet may constitute a backlight unit.

The reflective plate may be disposed on the bottom cover, and the light emitting module may emit light. The light guide plate is disposed in front of the reflection plate to guide the light emitted from the light emitting module to the front, and the optical sheet may include a prism sheet and the like, and may be disposed in front of the light guide plate. The display panel may be disposed in front of the optical sheet, the image signal output circuit may supply an image signal to the display panel, and the color filter may be disposed in front of the display panel.

Although the above-described embodiments are mainly described with reference to the embodiments of the present invention, the above are only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. A semiconductor device comprising:
a semiconductor structure including a first conductive semiconductor layer, an active layer, a second conductive semiconductor layer, and a plurality of first recesses and second recesses passing through the second conductive semiconductor layer and the active layer to be disposed up to a partial region of the first conductive semiconductor layer;
a first electrode disposed in each of the first recess and the second recess to be electrically connected to the first conductive semiconductor layer; and
a second electrode electrically connected to the second conductive semiconductor layer,
wherein the first conductive semiconductor layer, the active layer, the second conductive semiconductor layer include aluminum,
a number of total recesses that are immediately adjacent to each second recess is fewer than a number of total recesses that are immediately adjacent to each first recess, and
each of the plurality of first recesses is defined with a first opening at a top of each first recess for receiving the first electrode, each of the plurality of second recesses is defined with a second opening at a top of each second recess for receiving the first electrode, and an area of each first opening is smaller than an area of each second opening.

2. The semiconductor device of claim 1, wherein an area ratio of the first opening and the second opening is 1:1.2 to 1:2.

3. The semiconductor device of claim 1, wherein a closed-loop which connects centers of the second recesses that are immediately adjacent to one another among the plurality of second recesses surrounds the plurality of first recesses.

4. The semiconductor device of claim 1, comprising an electrode pad electrically connected to the second electrode.

5. The semiconductor device of claim 4, wherein:
the semiconductor structure includes a first side surface and a third side surface facing each other, a second side surface and a fourth side surface facing each other, a first edge portion configured to connect the first side surface and the second side surface, a second edge portion configured to connect the second side surface and the third side surface, a third edge portion configured to connect the third side surface and the fourth side surface, and a fourth edge portion configured to connect the fourth side surface and the first side surface; and
at least one of the third edge portion and the fourth edge portion includes a concave portion facing the electrode pad.

6. The semiconductor device of claim 5, wherein:
the second recesses include a plurality of first outer recesses disposed along the first side surface, a plurality of second outer recesses disposed along the second side surface, a plurality of third outer recesses disposed along the third side surface, a plurality of fourth outer recesses disposed along the fourth side surface, and a plurality of fifth outer recesses disposed along the concave portion;
the plurality of first outer recesses have different shortest distances from the first side surface;
the plurality of second outer recesses have the same shortest distance from the second side surface;
the plurality of third outer recesses have different shortest distances from the third side surface;
the plurality of fourth outer recesses have the same shortest distance from the fourth side surface; and
the plurality of fifth outer recesses have different shortest distances from the concave portion.

7. The semiconductor device of claim 6, wherein diameters of the respective second openings of the first outer recess and the third outer recess are larger than those of the second outer recess and the fourth outer recess.

8. The semiconductor device of claim 1, wherein:
the semiconductor structure includes a first side surface and a third side surface facing each other, and a second side surface and a fourth side surface facing each other;
the plurality of second recesses include a plurality of first outer recesses disposed along the first side surface, a plurality of second outer recesses disposed along the second side surface, a plurality of third outer recesses disposed along the third side surface, and a plurality of fourth outer recesses disposed along the fourth side surface; and
a minimum interval between the plurality of second recesses is smaller than a minimum interval between the plurality of first recesses.

9. The semiconductor device of claim 1, wherein:
the semiconductor structure includes a first side surface and a third side surface facing each other, and a second side surface and a fourth side surface facing each other;
the plurality of second recesses include a plurality of first outer recesses disposed along the first side surface, a plurality of second outer recesses disposed along the second side surface, a plurality of third outer recesses disposed along the third side surface, and a plurality of fourth outer recesses disposed along the fourth side surface; and
the respective second openings of the plurality of second outer recesses and the plurality of fourth outer recesses have larger areas than the respective second openings of the plurality of first outer recesses and the plurality of third outer recesses.

10. The semiconductor device of claim 1, wherein an emission intensity of a region between virtual lines which extend the plurality of second recesses and the semiconductor structure is 80% or more of an emission intensity of an inner region of the virtual lines.

11. The semiconductor device of claim 1, wherein the plurality of second recesses is connected to each other along side surfaces of the semiconductor structure.

12. The semiconductor device of claim 1, wherein each of the plurality of second recesses has an oval shape.

13. The semiconductor device of claim 1, wherein the second electrode is disposed between the plurality of second recesses and a side surface of the semiconductor structure.

14. The semiconductor device of claim 1, wherein a total area of the first and second openings of the plurality of first and second recesses is 20% or more of a maximum area of the semiconductor structure.

15. A semiconductor device comprising:
a semiconductor structure including a first conductive semiconductor layer, an active layer, a second conductive semiconductor layer, and a plurality of recesses passing through the second conductive semiconductor layer and the active layer to be disposed up to a partial region of the first conductive semiconductor layer;
a first electrode disposed in each of the plurality of recesses to be electrically connected to the first conductive semiconductor layer; and
a second electrode electrically connected to the second conductive semiconductor layer,
wherein the first conductive semiconductor layer, the active layer, the second conductive semiconductor layer include aluminum,
wherein the plurality of recesses include a plurality of first recesses each having a first opening at a top of each first recess for receiving the first electrode, and a plurality of second recesses each having a second opening at a top of each second recess for receiving the first electrode, an area of the second opening being smaller than an area of the first opening, and
wherein the second recess is disposed between a side surface of the semiconductor structure and the first recess which is the closest to the side surface of the semiconductor structure among the plurality of first recesses.

16. The semiconductor device of claim 15, wherein a minimum interval between the plurality of second recesses is smaller than a minimum interval between the plurality of first recesses.

17. The semiconductor device of claim 15, wherein the second electrode is disposed between the plurality of second recesses and the side surface of the semiconductor structure.

18. The semiconductor device of claim 15, wherein a total area of the first and second openings of the plurality of first and second recesses is 20% or more of a maximum area of the semiconductor structure.

19. The semiconductor device of claim 15, wherein a number of the plurality of recesses is 70 or more.

20. The semiconductor device of claim 19, wherein diameters of the first openings of the plurality of first recesses range from 38 μm to 60 μm.

* * * * *